(12) United States Patent
Shao et al.

(10) Patent No.: US 12,396,161 B2
(45) Date of Patent: Aug. 19, 2025

(54) SEMICONDUCTOR STRUCTURE INCLUDING BIT LINE COMPOSE OF A METAL LAYER AND A METAL SILICIDE LAYER AND MANUFACTURING METHOD THEREOF

(71) Applicant: CHANGXIN MEMORY TECHNOLOGIES, INC., Hefei (CN)

(72) Inventors: Guangsu Shao, Hefei (CN); Deyuan Xiao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 487 days.

(21) Appl. No.: 17/934,703

(22) Filed: Sep. 23, 2022

(65) Prior Publication Data

US 2023/0413536 A1    Dec. 21, 2023

(30) Foreign Application Priority Data

May 17, 2022   (CN) .......................... 202210540685.3

(51) Int. Cl.
  *H10B 12/00*   (2023.01)
  *H10D 30/67*   (2025.01)

(52) U.S. Cl.
  CPC ......... *H10B 12/482* (2023.02); *H10B 12/053* (2023.02); *H10B 12/488* (2023.02); *H10D 30/6735* (2025.01)

(58) Field of Classification Search
  CPC ... H10B 12/053; H10B 12/482; H10B 12/488
  See application file for complete search history.

(56) References Cited

U.S. PATENT DOCUMENTS

| | | |
|---|---|---|
| 2021/0028174 A1 | 1/2021 | Lee |
| 2023/0209811 A1* | 6/2023 | Shao .................... H10B 12/315 257/296 |

* cited by examiner

*Primary Examiner* — Nelson Garces
(74) *Attorney, Agent, or Firm* — Kilpatrick Townsend & Stockton LLP

(57) ABSTRACT

Embodiments of the present disclosure relate to the field of semiconductors, and provide a semiconductor structure and a manufacturing method thereof. The semiconductor structure includes: a substrate provided with a plurality trenches arranged at intervals; a bit line at least located on a sidewall of the trench, wherein both the bit line and the trench extend along a first direction; a bit line isolation layer filled in the trench; a plurality of first semiconductor pillars arranged at intervals on a surface of the substrate; a plurality of word lines arranged at intervals, wherein the word lines are separated from the substrate and cover the first semiconductor pillars by a certain height, the word line extends along a second direction, and the second direction is different from the first direction; and a dielectric layer at least located between the first semiconductor pillar and the word line.

13 Claims, 9 Drawing Sheets

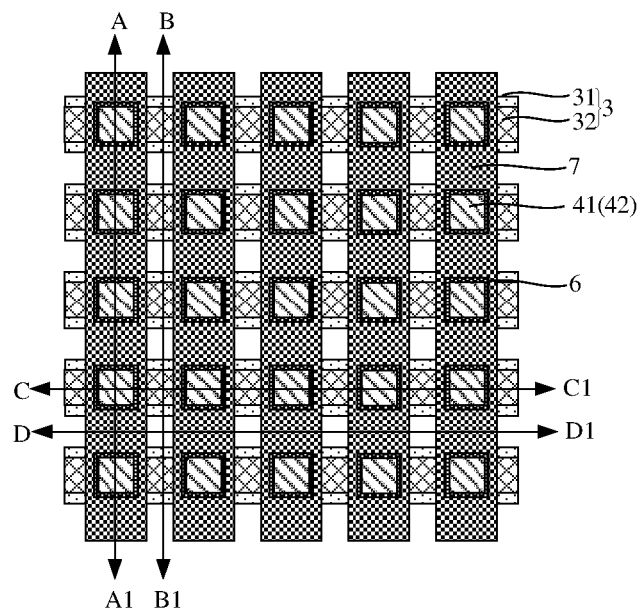
FIG. 1
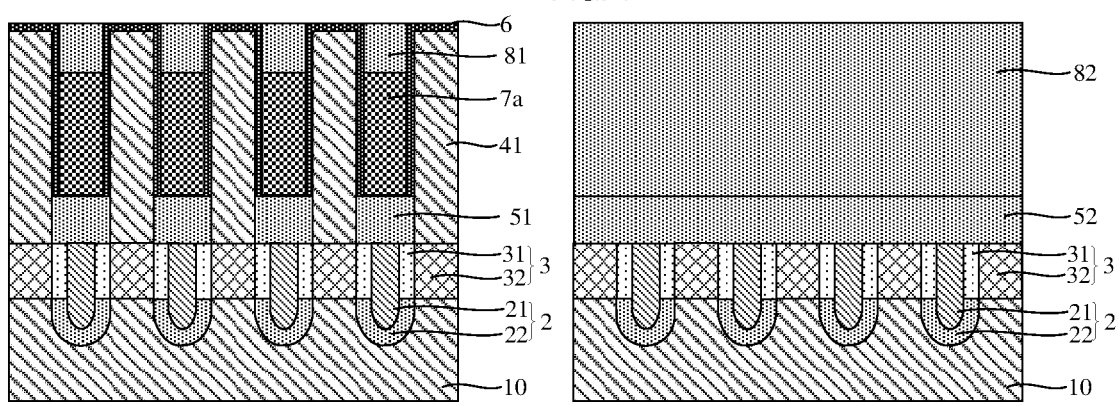
FIG. 2 (1)　　　　　　　　　　　　FIG. 2 (2)
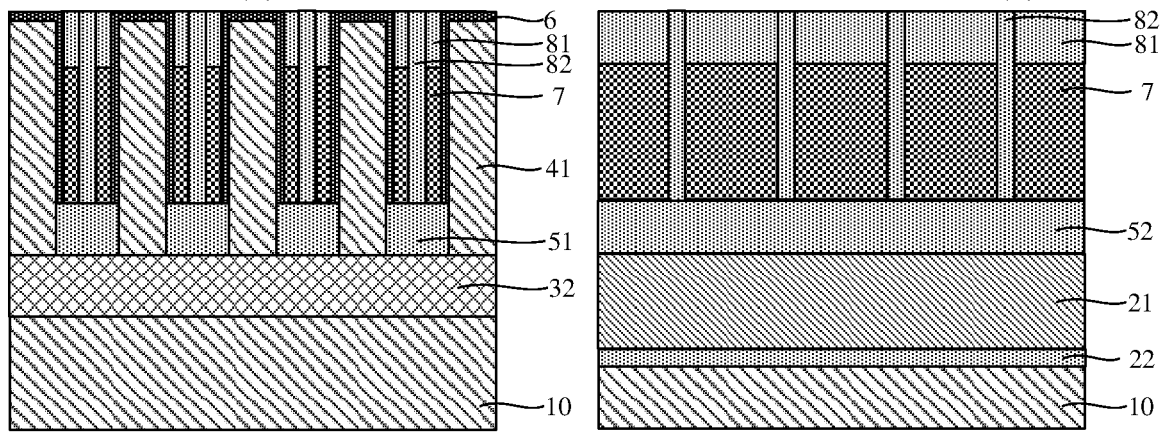
FIG. 2 (3)　　　　　　　　　　　　FIG. 2 (4)

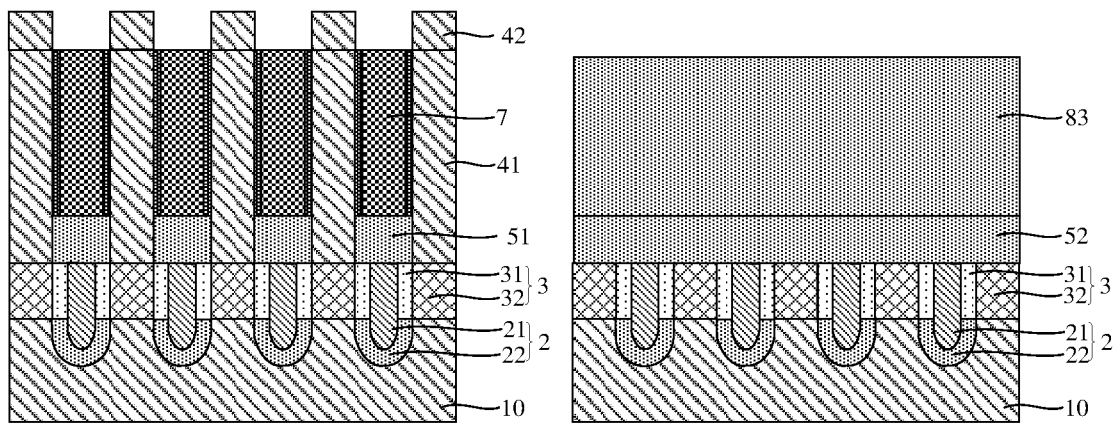
FIG. 3 (1)    FIG. 3 (2)
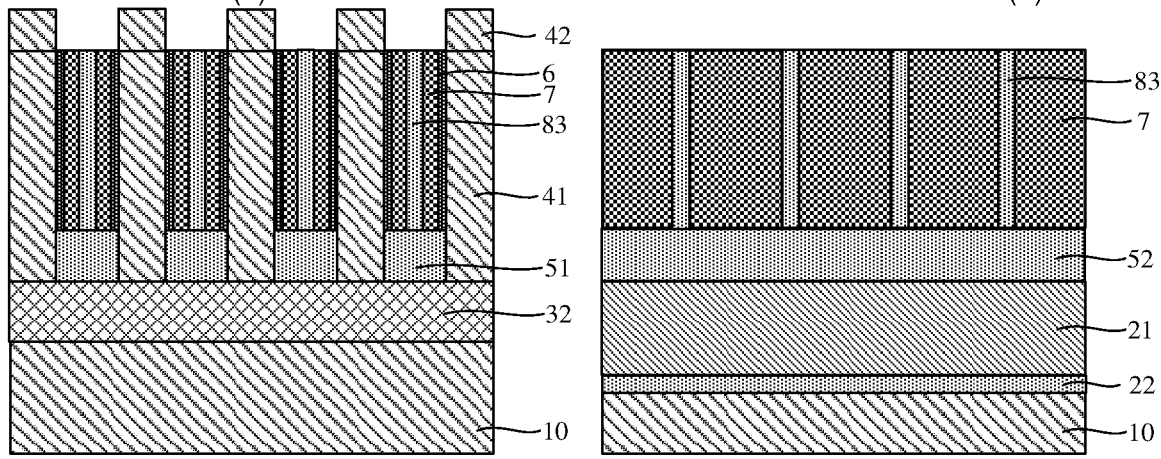
FIG. 3 (3)    FIG. 3 (4)
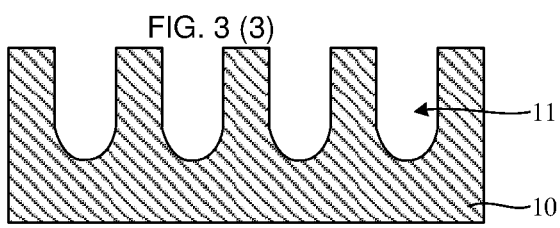
FIG. 4 (1)
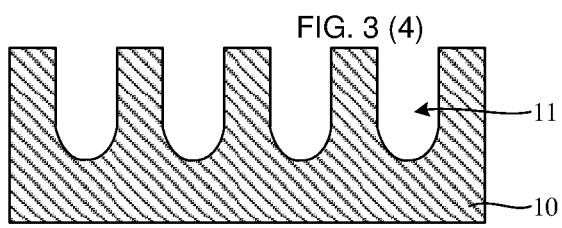
FIG. 4 (2)
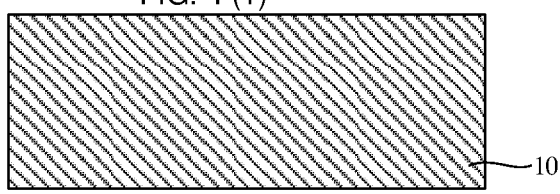
FIG. 4 (3)
FIG. 4 (4)
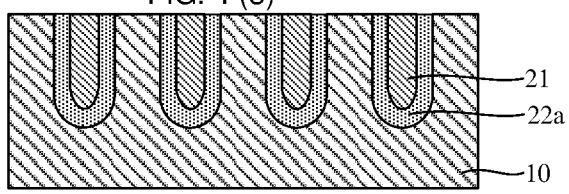
FIG. 5 (1)
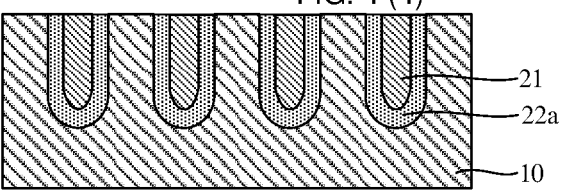
FIG. 5 (2)

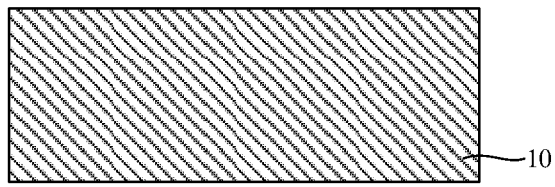
FIG. 5 (3)
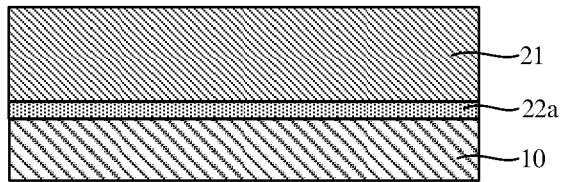
FIG. 5 (4)
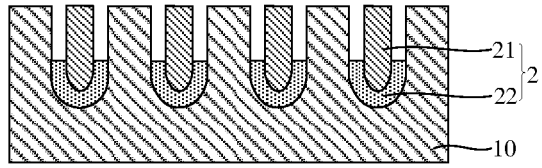
FIG. 6 (1)
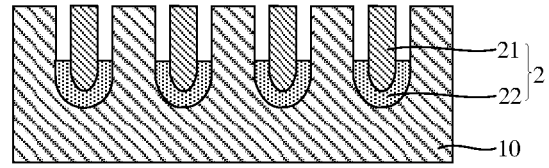
FIG. 6 (2)
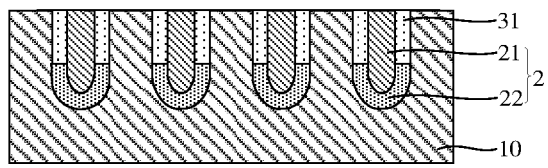
FIG. 7 (1)
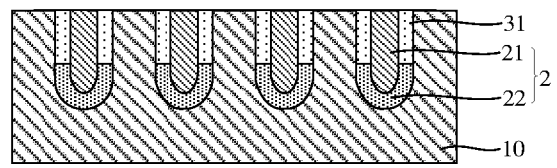
FIG. 7 (2)
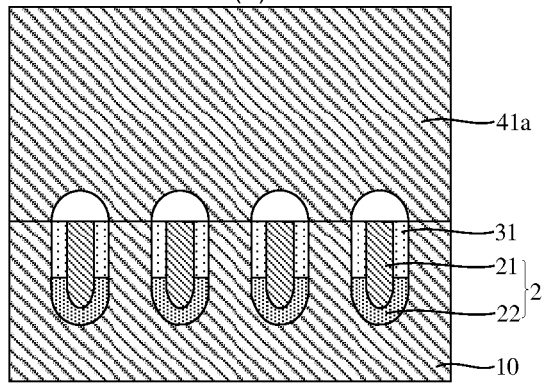
FIG. 8 (1)
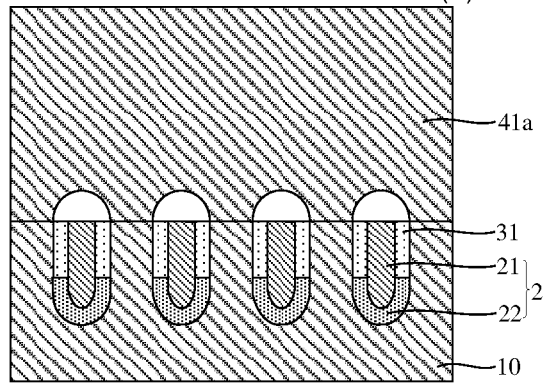
FIG. 8 (2)
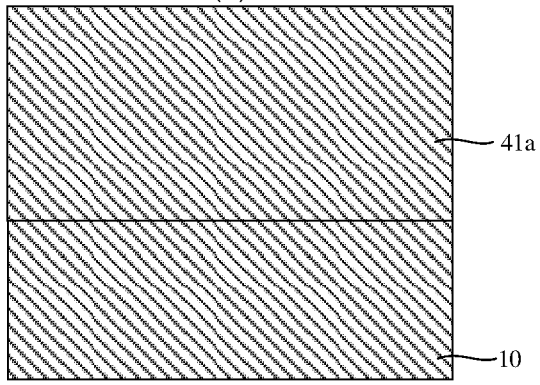
FIG. 8 (3)
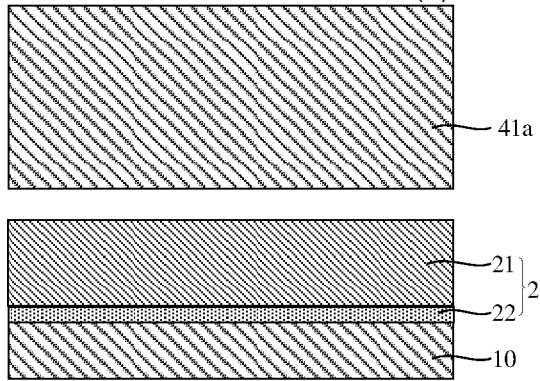
FIG. 8 (4)

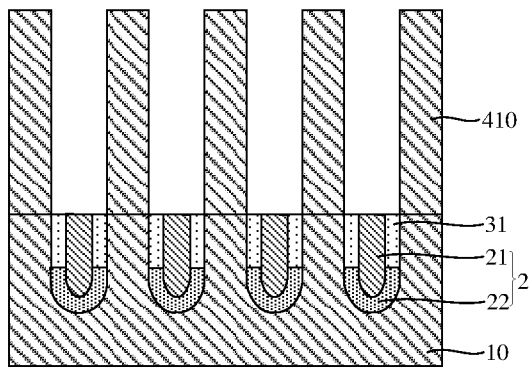
FIG. 9 (1)
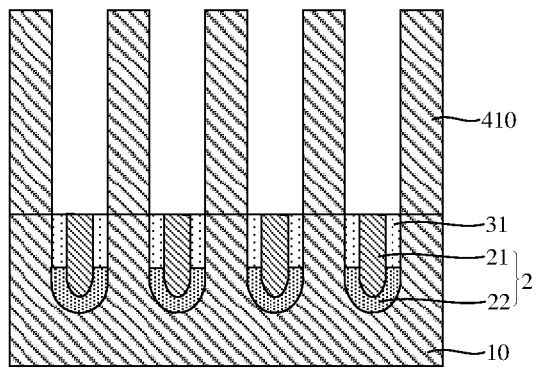
FIG. 9 (2)
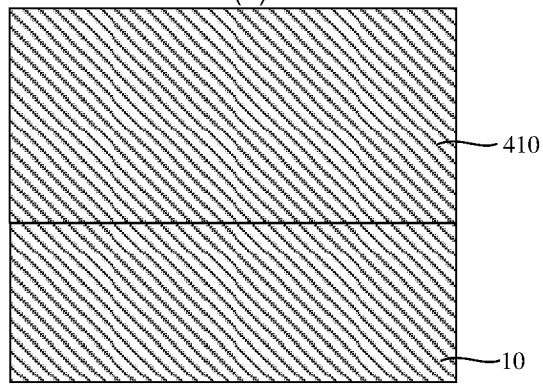
FIG. 9 (3)
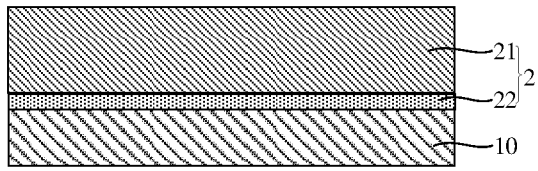
FIG. 9 (4)
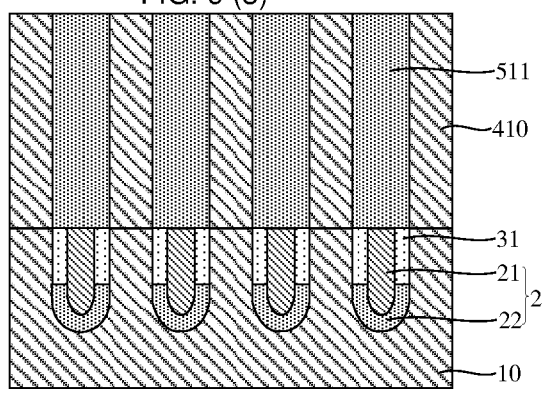
FIG. 10 (1)
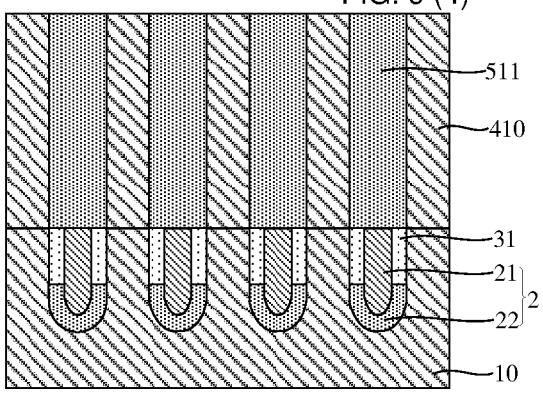
FIG. 10 (2)

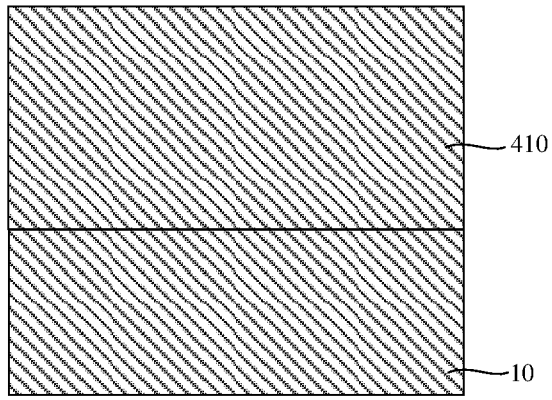
FIG. 10 (3)
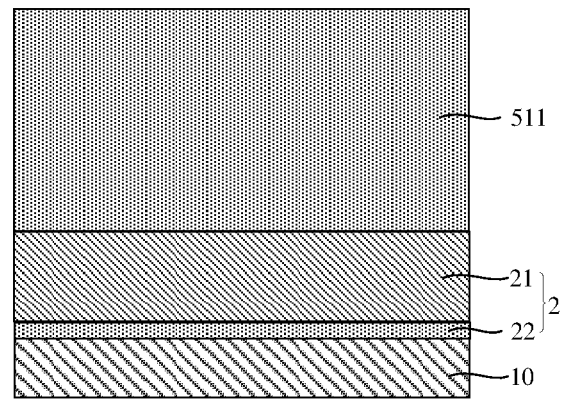
FIG. 10 (4)
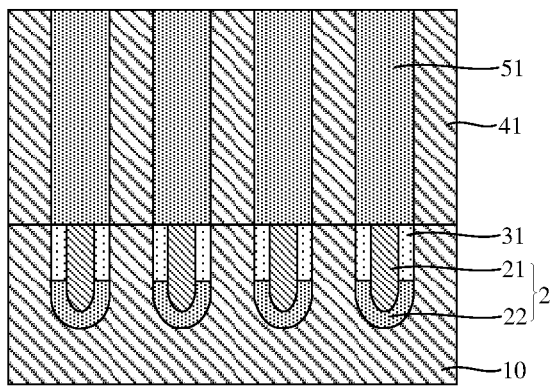
FIG. 11 (1)
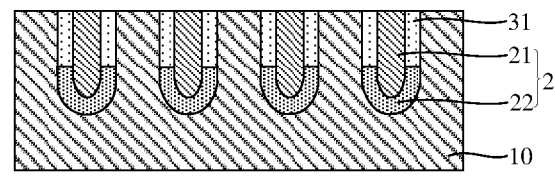
FIG. 11 (2)
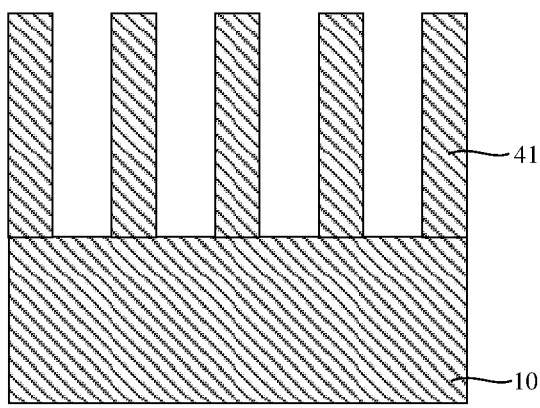
FIG. 11 (3)
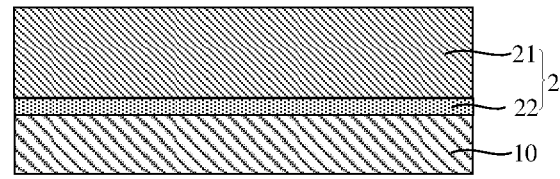
FIG. 11 (4)

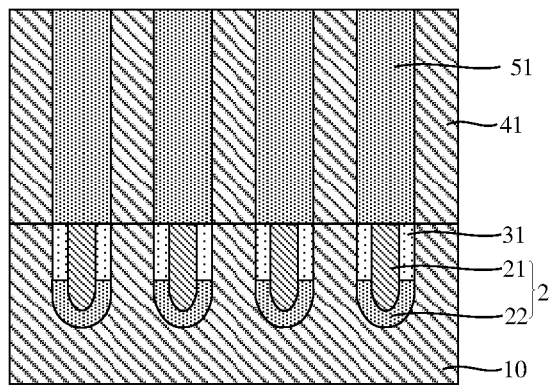
FIG. 12 (1)
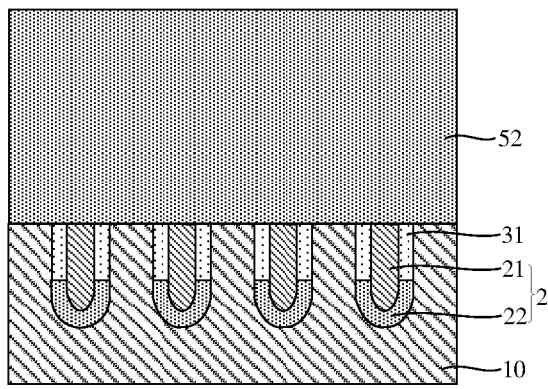
FIG. 12 (2)
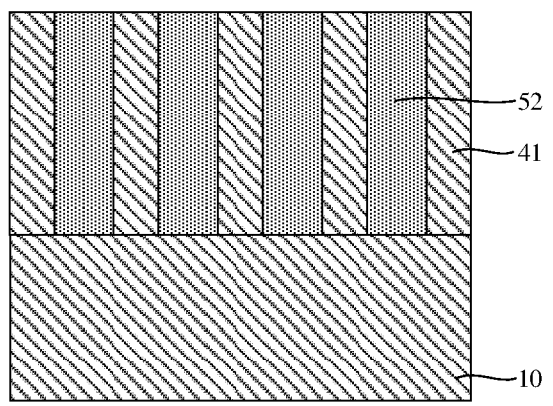
FIG. 12 (3)
FIG. 12 (4)
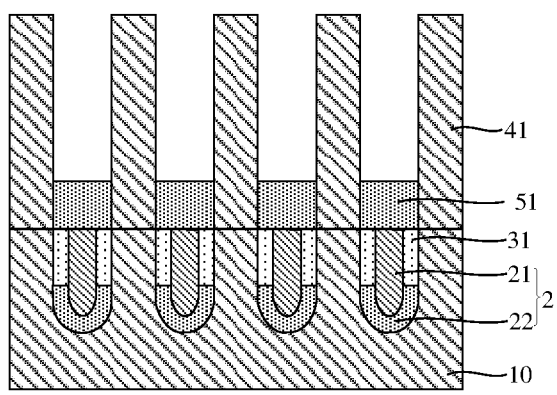
FIG. 13 (1)
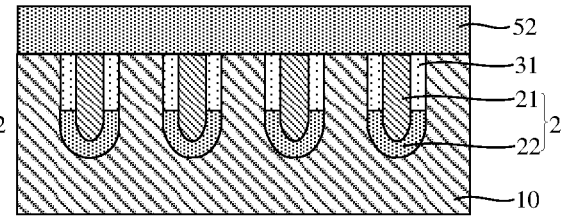
FIG. 13 (2)

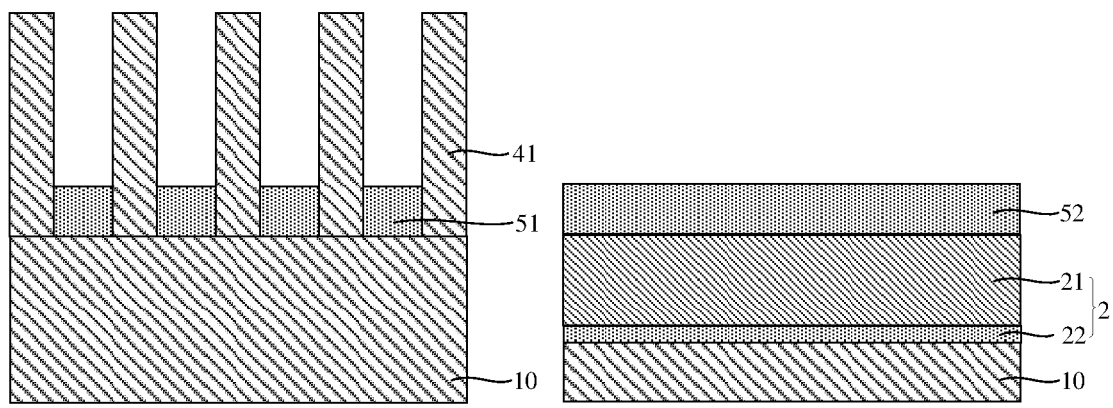
FIG. 13 (3)  FIG. 13 (4)
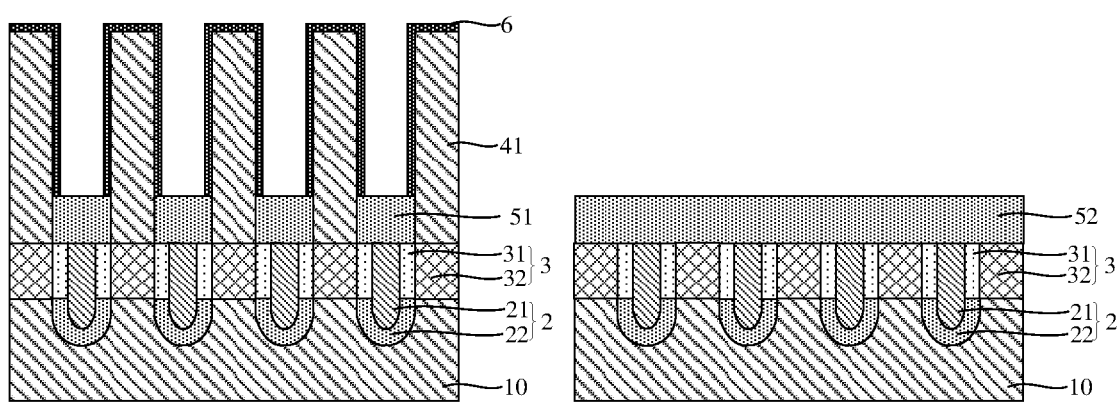
FIG. 14 (1)  FIG. 14 (2)
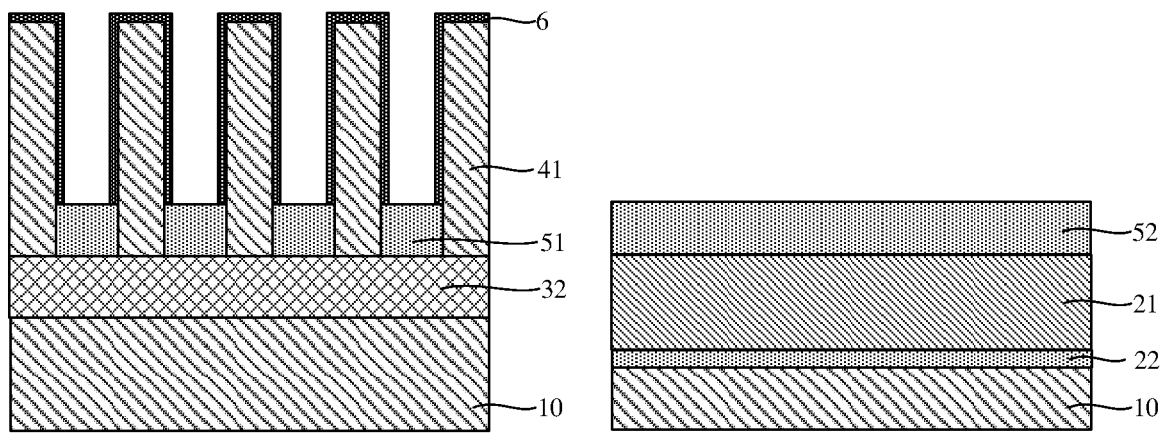
FIG. 14 (3)  FIG. 14 (4)

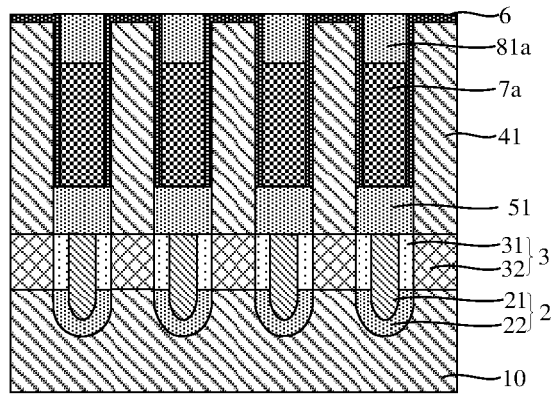
FIG. 15 (1)
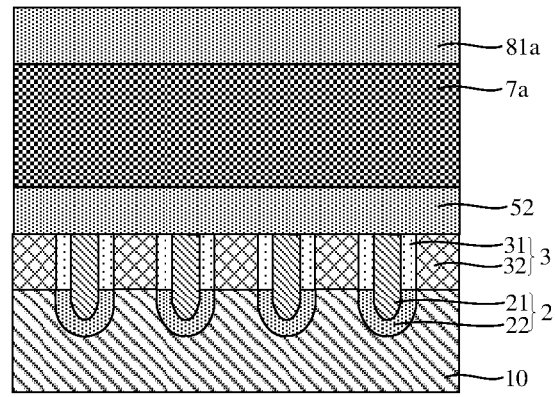
FIG. 15 (2)
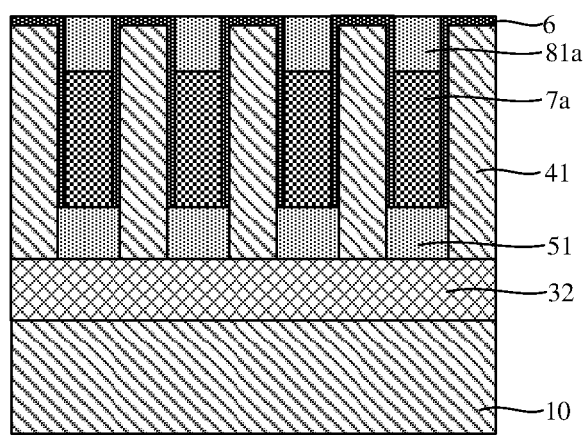
FIG. 15 (3)
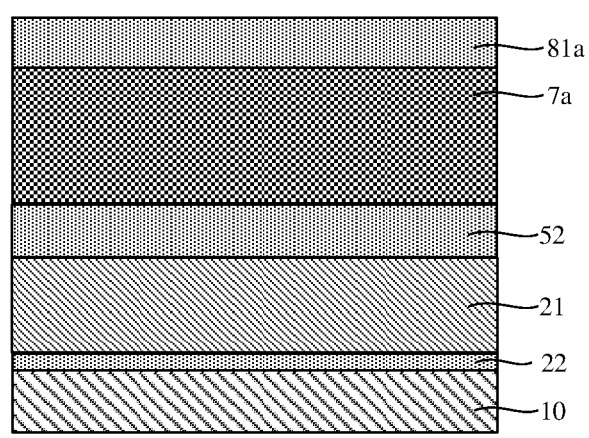
FIG. 15 (4)
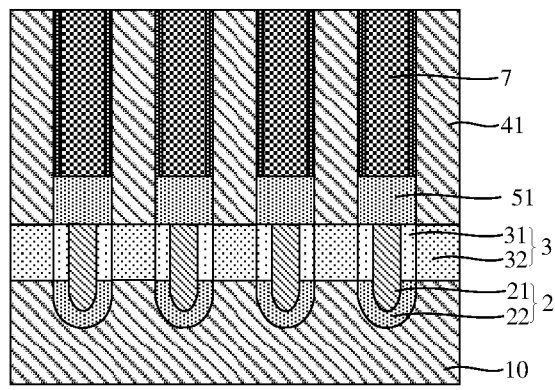
FIG. 16 (1)
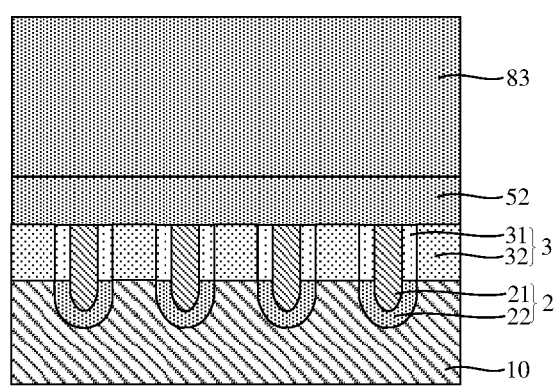
FIG. 16 (2)

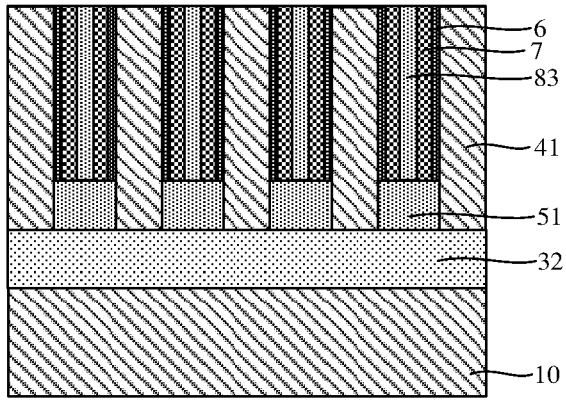
FIG. 16 (3)
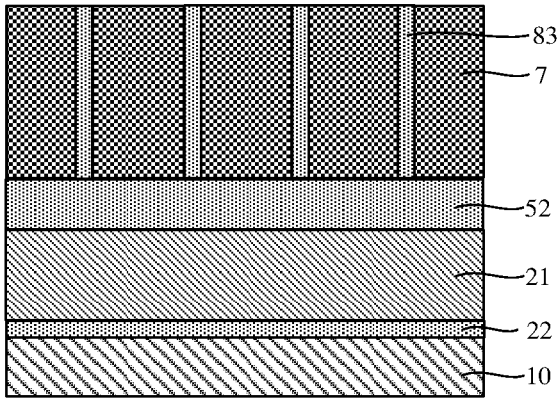
FIG. 16 (4)
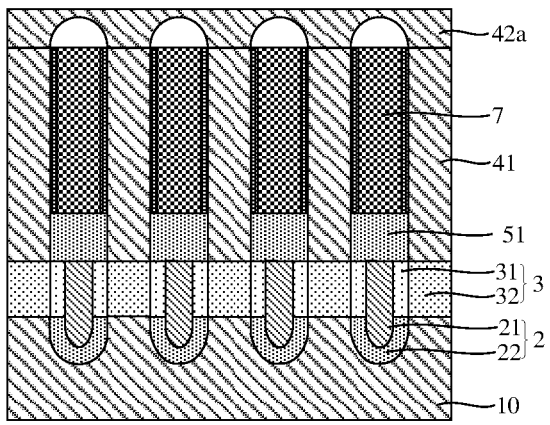
FIG. 17 (1)
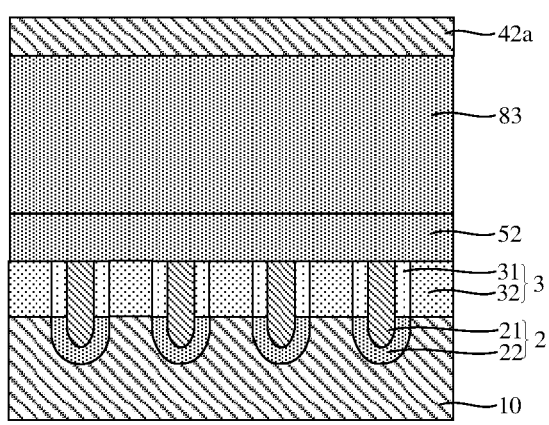
FIG. 17 (2)
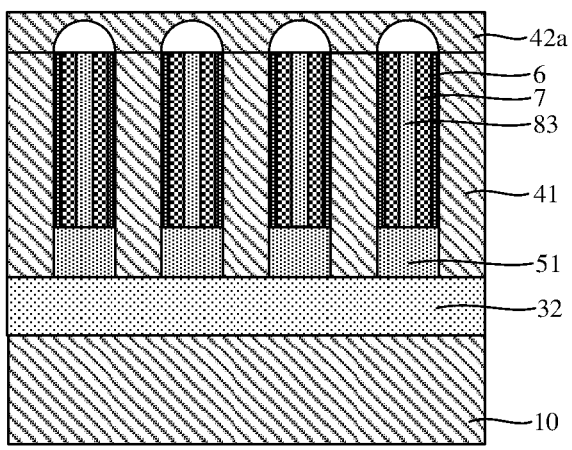
FIG. 17 (3)
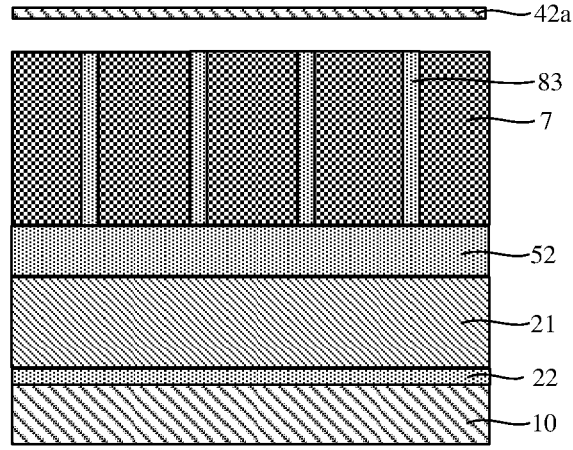
FIG. 17 (4)

SEMICONDUCTOR STRUCTURE INCLUDING BIT LINE COMPOSE OF A METAL LAYER AND A METAL SILICIDE LAYER AND MANUFACTURING METHOD THEREOF

CROSS-REFERENCE TO RELATED APPLICATIONS

This application claims the priority of Chinese Patent Application No. 202210540685.3, submitted to the Chinese Intellectual Property Office on May 17, 2022, the disclosure of which is incorporated herein in its entirety by reference.

TECHNICAL FIELD

The present disclosure relates to the field of semiconductors, and specifically, to a semiconductor structure and a manufacturing method thereof.

BACKGROUND

As a size of a semiconductor structure is miniaturized, a gate-all-around (GAA) transistor has become a research hotspot in the semiconductor field. A whole channel region of the GAA transistor is completely wrapped by a gate, so the GAA transistor has an excellent gate control capability and can overcome limitations of physical scaling and performance.

However, a bit line corresponding to a GAA structure has a complex process and large resistance, which has adverse impact on performance of the semiconductor structure.

SUMMARY

Embodiments of the present disclosure provide a semiconductor structure and a manufacturing method thereof.

According to some embodiments of the present disclosure, according to an aspect, the embodiments of the present disclosure provide a semiconductor structure, including: a substrate provided with a plurality trenches arranged at intervals; a bit line at least located on a sidewall of the trench, wherein both the bit line and the trench extend along a first direction; a bit line isolation layer filled in the trench; a plurality of first semiconductor pillars arranged at intervals on a surface of the substrate; a plurality of word lines arranged at intervals, wherein the word lines are separated from the substrate and cover the first semiconductor pillars by a certain height, the word line extends along a second direction, and the second direction is different from the first direction; and a dielectric layer at least located between the first semiconductor pillar and the word line.

According to some embodiments of the present disclosure, according to another aspect, the embodiments of the present disclosure further provide a method of manufacturing a semiconductor structure, including: providing a substrate; forming a plurality of trenches arranged at intervals in the substrate; forming a bit line at least located on a sidewall of the trench, wherein both the bit line and the trench extend along a first direction; forming a bit line isolation layer filled in the trench; after forming the bit line isolation layer, forming a plurality of first semiconductor pillars arranged at intervals on a surface of the substrate; forming a dielectric layer, wherein the dielectric layer covers a sidewall of the first semiconductor pillar by a certain height; and forming a plurality of word lines arranged at intervals, wherein the word lines are separated from the substrate, the word lines cover the first semiconductor pillars by a certain height and at least a part of the dielectric layer, the word lines extend along a second direction, and the second direction is different from the first direction.

Other features and advantages of the present disclosure will become more apparent based on the following detailed description, or partially obtained through practice of the present disclosure.

It should be understood that the above general description and the following detailed description are only exemplary and explanatory, and should not be construed as a limitation to the present disclosure.

BRIEF DESCRIPTIONS OF THE DRAWINGS

The accompanying drawings incorporated into the specification and constituting part of the specification illustrate the embodiments of the present disclosure, and serve, together with the specification, to explain the principles of the present disclosure. Apparently, the accompanying drawings in the following description show merely some embodiments of the present disclosure, and those of ordinary skill in the art may still derive other accompanying drawings from these drawings without creative efforts.

FIG. 1 is a top view of a local structure of a semiconductor structure according to an embodiment of the present disclosure;

FIG. 2 (1) to FIG. 2 (4) are cross-sectional views of a semiconductor structure in different directions according to an embodiment of the present disclosure;

FIG. 3 (1) to FIG. 3 (4) are cross-sectional views of a semiconductor structure in different directions according to another embodiment of the present disclosure;

FIG. 4 (1) to FIG. 4 (4), FIG. 5 (1) to FIG. 5 (4), FIG. 6 (1), FIG. 6 (2), FIG. 7 (1), FIG. 7 (2), FIG. 8 (1) to FIG. 8 (4), FIG. 9 (1) to FIG. 9 (4), FIG. 10 (1) to FIG. 10 (4), FIG. 11 (1) to FIG. 12 (4), FIG. 13 (1) to FIG. 13 (4), FIG. 14 (1) to FIG. 14 (4), and FIG. 15 (1) to FIG. 15 (4) are schematic structural diagrams corresponding to various steps of a method of manufacturing a semiconductor structure according to still another embodiment of the present disclosure; and FIG. 16 (1) to FIG. 16 (4) and FIG. 17 (1) to FIG. 17 (4) are schematic structural diagrams corresponding to various steps of a method of manufacturing a semiconductor structure according to yet another embodiment of the present disclosure.

DETAILED DESCRIPTION

According to the background, a bit line in a semiconductor structure has relatively large resistance and a complex process. Upon analysis, the main reasons are as follows: At present, a semiconductor pillar is usually formed first, and over-etching is performed on the bottom of the semiconductor pillar, and then metal atoms are diffused at an over-etching position to form the bit line. An over-etching process is difficult, and will cause a great damage to the semiconductor pillar. The formation of the bit line at the over-etching position produces large resistance.

The embodiments of the present disclosure provide a semiconductor structure and a method of manufacturing a semiconductor structure, such that a bit line is formed on a sidewall of a trench in a substrate, and the bit line can be connected to a semiconductor pillar through the substrate. Therefore, there is no need to etch the bottom of the semiconductor pillar and form the bit line at an over-etching position, which is conducive to reducing resistance of the bit line and improving performance of the semiconductor structure.

As shown in FIG. 1 and FIG. 2 (1) to FIG. 2 (4), an embodiment of the present disclosure provides a semiconductor structure, including: a substrate 10 provided with a plurality trenches arranged at intervals; bit lines 3 at least located on sidewalls of the trenches, where both the bit line 3 and the trench extend along a first direction; a bit line isolation layer 2 filled in the trench; a plurality of first semiconductor pillars 41 arranged at intervals on a surface of the substrate 10; a plurality of word lines 7 arranged at intervals, where the word lines are separated from the substrate 10 and cover the first semiconductor pillars 41 by a certain height, the word lines 7 extend along a second direction, and the second direction is different from the first direction; and a dielectric layer 6 at least located between the first semiconductor pillar 41 and the word line 7.

The semiconductor structure is described in detail below with reference to the accompanying drawings. FIG. 1 is a top view. In FIG. 1, a direction A-A1 is an extension direction of the word line 7, a direction B-B1 is an extension direction of an isolation structure between adjacent ones of the word lines 7, a direction C-C1 is an extension direction of the bit line 3, and a direction D-D1 is an extension direction of an isolation structure between adjacent ones of the bit lines 3. FIG. 2 (1) to FIG. 2 (4) are cross-sectional views of the semiconductor structure in the directions A-A1, B-B1, C-C1, and D-D1.

The substrate 10 may be a silicon substrate or a germanium substrate, and the substrate 10 may have doped ions to achieve different conductivity in different regions, which will be described in detail later.

The substrate 10 is provided with the trench, and the trench is provided with the bit line isolation layer 2. The bit line isolation layer 2 includes an edge isolation layer 22 and an internal isolation layer 21. The edge isolation layer 22 covers a bottom sidewall and a bottom surface of the trench, the bit line 3 covers at least a top sidewall of the trench, the edge isolation layer 22 and the bit line 3 enclose an internal trench, and the internal isolation layer 21 is filled in the internal trench.

It is not difficult to find that a height of the bit line isolation layer 2 is greater than that of the bit line 3 in a direction perpendicular to the surface of the substrate 10. The bit line isolation layer 2 not only is located between the adjacent ones of the bit lines 3, but also can cover bottom surfaces of some of the bit lines 3. This is conducive to improving a degree of isolation between the adjacent ones of the bit lines 3 and avoiding electric leakage.

For example, a material of the edge isolation layer 22 may be silicon oxide, while a material of the internal isolation layer 21 may be silicon nitride.

In some other embodiments, the bit line isolation layer 2 may alternatively be of a single-layer structure. In addition, in the direction perpendicular to the surface of the substrate 10, the height of the bit line isolation layer 2 may alternatively be the same as that of the bit line 3.

In some embodiments, the bit line 3 includes a metal layer 31 and a metal silicide layer 32 that are in contact with each other and extend along the first direction; and the metal layer 31 is located on a sidewall of the trench, and the metal silicide layer 32 is located in the substrate 10 between adjacent ones of the trenches. It should be noted that resistance of a metal material is low, which is conducive to reducing resistance of the bit line 3. In addition, the metal layer 31 can further provide metal atoms to convert the substrate 10 between adjacent metal layers 31 into the metal silicide layer 32, thereby forming ohmic contact between the metal layer 31 and the metal silicide layer 32 to reduce contact resistance.

In some other embodiments, the bit line 3 may alternatively include only the metal layer 31, in other words, the substrate 10 between the adjacent metal layers 31 may not be used to form the metal silicide layer 32. In addition, in order to reduce resistance of the substrate 10, the substrate 10 can also be doped to reduce contact resistance between the bit line 3 and the first semiconductor pillar 41.

For example, a material of the metal layer 31 may be titanium, cobalt, molybdenum, tungsten, or other metal.

In some embodiments, in a direction perpendicular to the sidewall of the trench, a ratio of a width of the metal layer 31 to a width of the internal isolation layer 21 is 1:1 to 1:2. It should be noted that the width of the metal layer 31 should not be too small, otherwise the resistance of the metal layer 31 may be increased; and the width of the metal layer 31 should not be too large, otherwise too much space in a channel is occupied, thereby reducing an isolation capability of the internal isolation layer 21. When the ratio of the width of the metal layer 31 to the width of the internal isolation layer 21 is within the above range, it can be ensured that the metal layer 31 has small resistance, and the isolation capability of the internal isolation layer 21 is ensured.

The first semiconductor pillar 41 includes a first source-drain region, a channel region, and a second source-drain region that are stacked, and the dielectric layer 6 further covers a sidewall of the channel region and a sidewall of the second source-drain region; and the word line 7 covers the dielectric layer 6 located in the channel region and exposes the dielectric layer 6 located on the sidewall of the second source-drain region. In other words, the word line 7 acts as a gate of a transistor, the dielectric layer 6 located in the channel region acts as a gate dielectric layer of the transistor, and the first source-drain region and the second source-drain region act as a source and a drain of the transistor respectively.

For example, the first semiconductor pillar 41 and the substrate 10 may be made of a same material, for example, silicon. A material of the word line 7 may be titanium, cobalt, molybdenum, tungsten, or other metal. The dielectric layer 6 may be made of silicon oxide, zirconium oxide, hafnium oxide, or niobium oxide.

The semiconductor structure further has an isolation structure. Specifically, the isolation structure may include a bottom isolation layer filled between bottoms of adjacent ones of the first semiconductor pillars 41, and the bottom isolation layer includes a first isolation block 51 and a second isolation wall 52. The isolation structure may further include a first isolation layer 81 and a second isolation layer 82. The first isolation layer 81 is located on the word line 7 and covers the top of the first semiconductor pillar 41. The second isolation layer 82 is located between the adjacent ones of the word lines 7 and is also filled between adjacent first isolation layers 81. The above isolation structures are illustrative, provided that the adjacent ones of the word lines 7 and the adjacent ones of the first semiconductor pillars 41 can be insulated.

To sum up, the first semiconductor pillar 41 is located on the surface of the substrate 10, and the bit line 3 is at least located on the sidewall of the trench in the substrate 10. When the bit line 3 includes the metal silicide layer 32, the bit line 3 can be directly electrically connected to the first semiconductor pillar 41. When the bit line 3 includes only the metal layer 31, the bit line 3 can be electrically connected to the first semiconductor pillar 41 through the substrate 10. In this way, there is no need to etch the bottom of the first semiconductor pillar 41 and form the bit line 3 at an over-etching position, which is conducive to reducing the resistance of the bit line 3. In addition, since the bottom of the first semiconductor pillar 41 has not been etched, strength of the first semiconductor pillar 41 is higher, which prevents the first semiconductor pillar 41 from being tilted or collapsed easily.

As shown in FIG. 3 (1) to FIG. 3 (4), another embodiment of the present disclosure provides a semiconductor structure. The semiconductor structure is roughly the same as the semiconductor structure provided in the above embodiment, with a main difference that the semiconductor structure in this embodiment further includes a second semiconductor pillar 42. For contents of the semiconductor structure that are same as or similar to those of the semiconductor structure in the above embodiment, reference may be made to the detailed description in the above embodiment. Details are not described herein again.

FIG. 3 (1) to FIG. 3 (4) are cross-sectional views of the semiconductor structure in directions A-A1, B-B1, C-C1, and D-D1. With reference to FIG. 1 and FIG. 3 (1) to FIG. 3 (4), the first semiconductor pillar 41 includes a first source-drain region and a channel region that are stacked, and the dielectric layer 6 covers a sidewall of the channel region; and the word line 7 cover the dielectric layer 6. The semiconductor structure further includes a plurality of second semiconductor pillars 42 arranged at intervals, located on the first semiconductor pillars 41, and directly opposite to the first semiconductor pillars 41 respectively, where the second semiconductor pillar 42 is used as a second source-drain region. In other words, a transistor is composed of the first semiconductor pillar 41, the second semiconductor pillar 42, the word line 7, and the dielectric layer 6 together, and the first semiconductor pillar 41 and the second semiconductor pillar 42 are formed in two process steps.

In some embodiments, a cross-sectional area of the second semiconductor pillars 42 is greater than a cross-sectional area of the first semiconductor pillar 41. Since the second semiconductor pillar 42 is formed after the first semiconductor pillar 41, increasing the cross-sectional area of the second semiconductor pillar 42 is conducive to avoiding an alignment error, so as to reduce contact area between the second semiconductor pillar 42 and the first semiconductor pillar 41. In some other embodiments, the cross-sectional area of the second semiconductor pillar 42 is equal to the cross-sectional area of the first semiconductor pillar 41.

Still another embodiment of the present disclosure provides a method of manufacturing a semiconductor structure. The manufacturing method can be applied to the semiconductor structure shown in FIG. 3 (1) to FIG. 3 (4). The manufacturing method is specifically described below with reference to the accompanying drawings.

Reference is made to FIG. 1 and FIG. 4 (1) to FIG. 4 (4). FIG. 4 (1) to FIG. 4 (4) are schematic diagrams of the semiconductor structure in directions A-A1, B-B1, C-C1, and D-D1. A substrate 10 is provided, where a plurality of trenches arranged at intervals are formed in the substrate 10. For example, a part of the substrate 10 is removed by using an etching process, to form the trenches that extend along a first direction. Compared with over-etching on the bottom of a semiconductor pillar, a formation process of the trenches is simpler.

Reference is made to FIG. 1 and FIG. 5 (1) to FIG. 5 (4). FIG. 5 (1) to FIG. 5 (4) are schematic diagrams of the semiconductor structure in the directions A-A1, B-B1, C-C1, and D-D1. An initial edge isolation layer 22a is formed on a sidewall of the trench, and an internal isolation layer 21 filled in the trench is formed, where the internal isolation layer 21 is in contact with the initial edge isolation layer 22a. For example, silicon oxide is deposited on the sidewall of the trench to form the initial edge isolation layer 22a, and silicon nitride is deposited to form the internal isolation layer 21. After that, flattening can be performed through chemical mechanical polishing to expose the substrate 10.

Reference is made to FIG. 1, FIG. 6 (1), and FIG. 6 (2). FIG. 6 (1) and FIG. 6 (2) are schematic diagrams of the semiconductor structure in the directions A-A1 and B-B1. It should be noted that schematic diagrams of the semiconductor structure corresponding to this step in the directions C-C1 and D-D1 are the same as those in the previous step. Reference may be made to FIG. 5 (3) and FIG. 5 (4). The initial edge isolation layer 22a located on a top sidewall of the trench is removed, and the remaining initial edge isolation layer 22a is used as an edge isolation layer 22, where the edge isolation layer 22 and the internal isolation layer 21 constitute a bit line isolation layer 2.

For example, the initial edge isolation layer 22a is selectively etched. For example, in a process of removing the initial edge isolation layer 22a located on the top sidewall of the trench, a selective etching ratio of the initial edge isolation layer 22a to the internal isolation layer 21 is greater than 2:1. In other words, most of the initial edge isolation layer 22a can be removed through etching, while the internal isolation layer 21 can be retained. A material of the internal isolation layer 21 includes silicon nitride, and a material of the edge isolation layer 22 includes silicon oxide.

Reference is made to FIG. 1 and FIG. 7 (1) and FIG. 7 (2). FIG. 7 (1) and FIG. 7 (2) are schematic diagrams of the semiconductor structure in the directions A-A1 and B-B1. It should be noted that schematic diagrams of the semiconductor structure corresponding to this step in the directions C-C1 and D-D1 are the same as those in the previous two steps. Reference may be made to FIG. 5 (3) and FIG. 5 (4). A metal layer 31 located on the top sidewall of the trench is formed, in other words, extension directions of the metal layer 31 and the trench are the same, namely, the first direction.

The metal layer 31 is used to form a part of a bit line 3. Subsequently, a metal silicification process will be carried out to convert the substrate 10 between adjacent metal layers 31 into a metal silicide layer 32. The metal silicide layer 32 and the metal layer 31 jointly constitute the bit line 3, which is conducive to reducing resistance of the bit line 3. In some other embodiments, the bit line 3 may include only the metal layer 31, and no metal silicification is performed.

So far, based on FIG. 5 (1) to FIG. 5 (4), FIG. 6 (1), FIG. 6 (2), FIG. 7 (1), and FIG. 7 (2), the metal layer 31 and the bit line isolation layer 2 can be formed in the trench. The metal layer 31 is located on the sidewall of the trench and is in contact with the bit line isolation layer 2. The above steps are only illustrative and are not limited to thereto. For example, in some other embodiments, an initial metal layer can be formed on an internal wall of the trench first, and the initial metal layer on a bottom wall of the trench is removed, such that the initial metal layers on two sidewalls of the trench are disconnected from each other, and the remaining initial metal layer is used as the metal layer 31. After the initial metal layer is formed, the bit line isolation layer 2 filled in the trench is formed to isolate the metal layers 31 located on two sidewalls of a channel.

Reference is made to FIG. 1 and FIG. 8 (1) to FIG. 8 (4). FIG. 8 (1) to FIG. 8 (4) are schematic diagrams of the semiconductor structure in the directions A-A1, B-B1, C-C1, and D-D1. A first semiconductor layer 41a covering the substrate 10 is formed. A method for forming the first semiconductor layer 41a includes an epitaxial growth process. Specifically, epitaxial silicon grows upward from a surface of the substrate 10, grows laterally such that tops grow together, and then continues to epitaxially grow upward. In some other embodiments, the first semiconductor layer 41a may alternatively be formed by using a chemical vapor deposition process.

In some embodiments, the forming a first semiconductor layer 41a includes forming a first source-drain film, a channel film, and a second source-drain film that are stacked, where the first source-drain film, the channel film, and the second source-drain film constitute the first semiconductor layer 41a. The first source-drain film and the second source-drain film have doped ions, and their doped ions are of a same type, such as N-type ions or P-type ions. A type of doped ions of the channel film is reverse to that of the doped ions of the first source-drain film and the second source-drain film.

It should be noted that the channel film is subsequently used to form a channel region. The epitaxial growth process makes it easier to control a thickness of the channel film, which is conducive to shortening a length of the channel region and improving performance of the semiconductor structure.

In some other embodiments, the forming a first semiconductor layer 41a includes forming a first source-drain film and a channel film that are stacked, where the first source-drain film and the channel film constitute the first semiconductor layer 41a. The first source-drain film has doped ions, and a type of doped ions of the channel film is reverse to that of the doped ions of the first source-drain film. This will be described in detail below.

Reference is made to FIG. 1 and FIG. 9 (1) to FIG. 9 (4). FIG. 9 (1) to FIG. 9 (4) are schematic diagrams of the semiconductor structure in the directions A-A1, B-B1, C-C1, and D-D1. A part of the first semiconductor layer 41a is removed along the first direction to form a plurality of first semiconductor walls 410 arranged at intervals, where the first semiconductor wall 410 extends along the first direction and is located on the substrate 10 between adjacent ones of the trenches. In other words, the first semiconductor layer 41a is etched along the extension direction of the metal layer 31 to form the first semiconductor wall 410.

Reference is made to FIG. 1 and FIG. 10 (1) to FIG. 10 (4). FIG. 10 (1) to FIG. 10 (4) are schematic diagrams of the semiconductor structure in the directions A-A1, B-B1, C-C1, and D-D1. A first isolation wall 511 between adjacent ones of the first semiconductor walls 410 is formed. Specifically, silicon oxide is deposited to form the first isolation wall 511.

Reference is made to FIG. 1 and FIG. 11 (1) to FIG. 11 (4). FIG. 11 (1) to FIG. 11 (4) are schematic diagrams of the semiconductor structure in the directions A-A1, B-B1, C-C1, and D-D1. A part of the first semiconductor wall and a part of the first isolation wall 511 are removed along a second direction to form a first semiconductor pillar 41 and a first isolation block 51, where the first semiconductor pillar 41 and the first isolation block 51 are alternately arranged in the second direction. In other words, the first semiconductor wall 410 is etched along an extension direction of the subsequently formed bit line 3. It should be noted that in an etching process, the first isolation layer 81 can protect the first semiconductor wall 410, thereby improving pattern accuracy of the first semiconductor pillar 41.

Reference is made to FIG. 1 and FIG. 12 (1) to FIG. 12 (4). FIG. 12 (1) to FIG. 12 (4) are schematic diagrams of the semiconductor structure in the directions A-A1, B-B1, C-C1, and D-D1. A second isolation wall 52 between adjacent ones of the first semiconductor pillars 41 and between adjacent first isolation blocks 51 is formed. Specifically, silicon oxide is deposited to form the second isolation wall 52. The second isolation wall 52 and the first isolation block 51 are jointly used to isolate adjacent first semiconductor pillars 41.

So far, based on FIG. 9 (1) to FIG. 9 (4), FIG. 10 (1) to FIG. 10 (4), FIGS. 11 (1) to 11 (4), and FIG. 12 (1) to FIG. 12 (4), first patterning processing can be performed on the first semiconductor layer 41a to form a plurality of first semiconductor pillars 41 arranged at intervals on the surface of the substrate 10. The first patterning processing includes two etching processes, which is conducive to shortening time of single etching, thereby reducing a damage caused by the etching process to the first semiconductor pillar 41, and improving accuracy of patterning processing.

The above first patterning processing is only illustrative and is not limited to thereto. For example, in some other embodiments, the first semiconductor layer 41a may be etched along the second direction (namely, an extension direction of a subsequently formed word line 7) first to form a semiconductor wall; an isolation wall is filled between adjacent semiconductor walls; the semiconductor wall and the isolation wall are etched along the first direction (namely, the extension direction of the bit line 3) to form the first semiconductor pillar 41 and an isolation block; and the isolation wall is filled again between adjacent first semiconductor pillars 41 and between adjacent isolation blocks to isolate the adjacent first semiconductor pillars 41. In addition, in some other embodiments, one etching process may be performed on the first semiconductor layer to form the first semiconductor pillar 41.

In addition, it should be noted that in some embodiments, a first source-drain region, the channel region, and a second source-drain region that are stacked can be formed through the first patterning processing, where the first source-drain region, the channel region, and the second source-drain region constitute the first semiconductor pillar 41. In this case, the first semiconductor pillar 41, the subsequently formed word line 7, and a dielectric layer 6 can constitute a complete transistor. In some other embodiments, a first source-drain region and the channel region that are stacked can be formed through the first patterning processing, where the first source-drain region and the channel region constitute the first semiconductor pillar 41. In this case, a second semiconductor pillar 42 needs to be formed subsequently, and the first semiconductor pillar 41, the second semiconductor pillar 42, the subsequently formed word line 7, and a dielectric layer 6 can constitute a complete transistor.

Reference is made to FIG. 1 and FIG. 13 (1) to FIG. 13 (4). FIG. 13 (1) to FIG. 13 (4) are schematic diagrams of the semiconductor structure in the directions A-A1, B-B1, C-C1, and D-D1. The first isolation block 51 and the second isolation wall 52 are removed by a certain height, such that the remaining first isolation block 51 and second isolation wall 52 serve as a bottom isolation layer to cover a bottom sidewall of the first semiconductor pillar 41. In other words, the isolation structure between the adjacent first semiconductor pillars 41 is etched back to expose the first semiconductor pillar 41 by a certain height.

Reference is made to FIG. 1 and FIG. 14 (1) to FIG. 14 (4). FIG. 14 (1) to FIG. 14 (4) are schematic diagrams of the semiconductor structure in the directions A-A1, B-B1, C-C1, and D-D1. It should be noted that the first semiconductor pillar 41 shown in FIG. 14 (1) to FIG. 14 (4) includes the first source-drain region, the channel region, and the second source-drain region. The dielectric layer 6 is formed, where the dielectric layer 6 covers a sidewall of the first semiconductor pillar 41 by a certain height. Specifically, the dielectric layer 6 covers a sidewall of the channel region and a sidewall of the second source-drain region. In addition, the dielectric layer 6 can further cover a top surface of the first semiconductor pillar 41.

For example, the dielectric layer 6 is formed by using an in-situ steam generation (ISSG) process. The dielectric layer 6 formed by using the ISSG process has a good step coverage capability, which is conducive to improving quality of the dielectric layer 6. Due to high temperature of the ISSG process, a metal silicide process can be carried out by using formation temperature of the dielectric layer 6, which is conducive to simplifying production steps.

The metal silicide process can enable metal atoms in the metal layer 31 to diffuse to the substrate 10 between the adjacent ones of the trenches to form the metal silicide layer 32, where the metal silicide layer 32 and the metal layer 31 constitute the bit line 3. Both the bit line 3 and the trench extend along the first direction. In some other embodiments, the metal silicide layer 32 may not be formed, and only the metal layer 31 is formed. In other words, the bit line 3 is at least located on the sidewall of the trench.

In some other embodiments, the dielectric layer 6 can alternatively cover only the sidewall of the channel region, which will be described in detail later in combination with the accompanying drawings.

Reference is made to FIG. 1 and FIG. 15 (1) to FIG. 15 (4). FIG. 15 (1) to FIG. 15 (4) are schematic diagrams of the semiconductor structure in the directions A-A1, B-B1, C-C1, and D-D1. An initial word line 7a and a first isolation film are formed. Specifically, a word line film filled between adjacent channel regions and between adjacent second source-drain regions is formed, and the word line film further covers the dielectric layer 6. The word line film is etched back to remove the word line film filled between the adjacent second source-drain regions, and the remaining word line film is used as the initial word line 7a. After the initial word line 7a is formed, the first isolation film 81a filled between the adjacent second source-drain regions is formed.

Specifically, a metal material is deposited to form the word line film, the word line film is etched back to reduce a height of the word line film, and silicon oxide is deposited to form the first isolation film 81a. After the first isolation film 81a is formed, flattening can be performed through chemical mechanical polishing.

Reference is still made to FIG. 1 and FIG. 2 (1) to FIG. 2 (4). FIG. 2 (1) to FIG. 2 (4) are schematic diagrams of the semiconductor structure in the direction A-A1, B-B1, C-C1, and D-D1. A part of the first isolation film 81a and the initial word line 7a are removed along the second direction to form a plurality of first isolation layers 81 arranged at intervals, a plurality of word lines 7 arranged at intervals, and a word line isolation trench between adjacent ones of the first isolation layers 81 and between adjacent ones of the word lines 7. In this case, the word line 7 covers the dielectric layer 6 located on the sidewall of the channel region and exposes the dielectric layer 6 located on the sidewall of the second source-drain region.

In other words, the first isolation film and the initial word line 7a are etched back. In the etching process, because a height of the initial word line 7a is small, it is beneficial to shorten the etching time of the initial word line 7a and improve uniformity of etching.

A second isolation layer 72 filled in the word line isolation trench is formed. For example, silicon oxide is deposited in the word line isolation trench to form the second isolation layer 72.

So far, based on FIG. 15 (1) to FIG. 15 (4) and FIG. 2 (1) to FIG. 2 (4), the word lines 7 arranged at intervals are formed, where the word lines 7 are separated from the substrate 10, the word lines 7 cover the first semiconductor pillars by a certain height and at least a part of the dielectric layer 6, the word lines 7 extend along the second direction, and the second direction is different from the first direction. The above steps are only illustrative and are not limited to thereto. For example, in some other embodiments, after the word line film filled between the adjacent channel regions and between the adjacent second source-drain regions is formed, the word line film can be etched first to form the word line trench, and an isolation material is filled in the word line trench. After that, heights of the word line film and the isolation material are reduced.

To sum up, in this embodiment of the present disclosure, the metal layer 31 can be formed first in the trench, and then the first semiconductor pillar 41 is formed by using the epitaxial growth process. After that, the metal silicide layer 32 is formed by using the formation temperature of the dielectric layer 6, which is conductive to simplifying a formation process of an embedded bit line 3 and reducing the resistance of the bit line 3.

Yet another embodiment of the present disclosure provides a method of manufacturing a semiconductor structure. The manufacturing method can be applied to the semiconductor structure shown in FIG. 3 (1) to FIG. 3 (4). The manufacturing method is roughly the same as the manufacturing method in the above embodiment, with a main difference that a second semiconductor pillar 42 is also formed on a first semiconductor pillar 41. For steps of forming structures such as a bit line 3, a bit line isolation layer 2, the first semiconductor pillar 41, and a bottom isolation layer in the manufacturing method, reference may be made to the detailed description in the above embodiment, and to FIG. 4 (1) to FIG. 4 (4), FIG. 5 (1) to FIG. 5 (4), FIG. 6 (1), FIG. 6 (2), FIG. 7 (1), FIG. 7 (2), FIG. 8 (1) to FIG. 8 (4), FIG. 9 (1) to FIG. 9 (4), FIG. 10 (1) to FIG. 10 (4), FIG. 11 (1) to FIG. 12 (4), and FIG. 13 (1) to FIG. 13 (4). Process steps after the first semiconductor pillar 41 and the bottom isolation layer are formed are described below.

Reference is made to FIG. 1 and FIG. 16 (1) to FIG. 16 (4). FIG. 16 (1) to FIG. 16 (4) are schematic diagrams of the semiconductor structure in directions A-A1, B-B1, C-C1, and D-D1. It should be noted that the first semiconductor pillar 41 shown in FIG. 16 (1) to FIG. 16 (4) includes a first source-drain region and a channel region that are stacked. A dielectric layer 6 and a word line 7 are formed. The dielectric layer 6 covers a sidewall of the channel region, and the word line 7 covers the dielectric layer 6.

Specifically, the dielectric layer 6 is formed by using an ISSG process, and a metal silicide process is carried out to form a metal silicide layer 32, so as to form ohmic contact with a metal layer 31 and reduce resistance. After that, a conductive material is deposited in the middle and on the top of the first semiconductor pillar 41 to form a word line film. Then, the word line film is etched to form mutually discrete word lines 7. A word line isolation layer 83 is filled in adjacent ones of the word lines 7. It should be noted that a formation process of the word line 7 is relatively simple because there is no need to reduce a height of the word line 7.

Reference is made to FIG. 1 and FIG. 17 (1) to FIG. 17 (4). FIG. 17 (1) to FIG. 17 (4) are schematic diagrams of the semiconductor structure in the directions A-A1, B-B1, C-C1, and D-D1. A second semiconductor layer 42a located on the first semiconductor pillar 41 is formed, and the second semiconductor layer 42a is used as a second source-drain film. For example, a silicon layer is grown by using an epitaxial growth process to form a second semiconductor layer 42a, and a dopant gas can be introduced in the growth process, such that a type of doped irons of the second source-drain film is the same as that of doped ions of a first source-drain film. Since a height of the second semiconductor layer 42a is small, the top of the second semiconductor layer may not be sealed.

In some other embodiments, the second semiconductor layer 42a may alternatively be formed by using a chemical vapor deposition process.

Reference is made to FIG. 1 and FIG. 3 (1) to FIG. 3 (4). FIG. 3 (1) to FIG. 3 (4) are schematic diagrams of the semiconductor structure in the directions A-A1, B-B1, C-C1, and D-D1. Second patterning processing is performed on the second semiconductor layer 42a to form a plurality of second semiconductor pillars 42 arranged at intervals, where the second semiconductor pillars 42 are each used as a second source-drain region and are directly opposite to first semiconductor pillars 41 respectively.

Specifically, since the height of the second semiconductor layer 42a is small, the second semiconductor pillar 42 can be formed by using one etching process, and there is no need to form the second semiconductor layer by using two etching processes from two directions.

To sum up, the second semiconductor pillar 42 can be grown on the first semiconductor pillar 41, and the first semiconductor pillar 41, the second semiconductor pillar 42, the word line 7, and the dielectric layer 6 jointly constitute a transistor.

In this specification, the description of terms such as "some embodiments" and "for example" means that a specific feature, structure, material or characteristic described in combination with the embodiments or example are included in at least one embodiment or example of the present disclosure. In this specification, the illustrative expressions of the above terms do not necessarily refer to a same embodiment or example. Furthermore, the specific feature, structure, material, or characteristic described may be combined in a suitable manner in any one or more of embodiments or examples. In addition, a person skilled in the art may combine different embodiments or examples described in this specification and characteristics of the different embodiments or examples without mutual contradiction.

Although the embodiments of the present disclosure have been shown and described above, it can be understood that the above embodiments are exemplary and cannot be understood as limitations to the present disclosure. Those skilled in the art can change, modify, replace and modify the above embodiments within the scope of the present disclosure. Therefore, all changes or modifications made in accordance with the claims and specifications of the present disclosure should be within the scope of the patent of the present disclosure.

The invention claimed is:

1. A semiconductor structure, comprising:
   a substrate provided with a plurality of trenches arranged at intervals;
   a bit line at least located on a sidewall of the trench, wherein both the bit line and the trench extend along a first direction;
   a bit line isolation layer filled in the trench;
   a plurality of first semiconductor pillars arranged at intervals on a surface of the substrate;
   a plurality of word lines arranged at intervals, wherein the word lines are separated from the substrate and cover the first semiconductor pillars by a certain height, the word line extends along a second direction, and the second direction is different from the first direction; and
   a dielectric layer at least located between the first semiconductor pillar and the word line;
   wherein the bit line comprises a metal layer and a metal silicide layer that are in contact with each other and extend along the first direction; and the metal layer is located on the sidewall of the trench, and the metal silicide layer is located in the substrate between adjacent ones of the trenches.

2. The semiconductor structure according to claim 1, wherein the bit line isolation layer comprises an edge isolation layer and an internal isolation layer, the edge isolation layer covers a bottom sidewall and a bottom surface of the trench, the bit line covers at least a top sidewall of the trench, the edge isolation layer and the bit line enclose an internal trench, and the internal isolation layer is filled in the internal trench.

3. The semiconductor structure according to claim 1, wherein the first semiconductor pillar comprises a first source-drain region, a channel region, and a second source-drain region that are stacked, and the dielectric layer further covers a sidewall of the channel region and a sidewall of the second source-drain region; and
   the word line covers the dielectric layer located in the channel region and exposes the dielectric layer located on the sidewall of the second source-drain region.

4. The semiconductor structure according to claim 1, wherein the first semiconductor pillar comprises a first source-drain region and a channel region that are stacked, and the dielectric layer covers a sidewall of the channel region; and the word line covers the dielectric layer; and
   the semiconductor structure further comprises a plurality of second semiconductor pillars arranged at intervals, located on the first semiconductor pillars, and directly correspond to the first semiconductor pillars respectively, wherein the second semiconductor pillar is used as a second source-drain region.

5. The semiconductor structure according to claim 4, wherein a cross-sectional area of the second semiconductor pillar is greater than a cross-sectional area of the first semiconductor pillar.

6. A method of manufacturing a semiconductor structure, comprising:
   providing a substrate;
   forming a plurality of trenches arranged at intervals in the substrate;
   forming a bit line at least located a sidewall of the trench, wherein both the bit line and the trench extend along a first direction;
   forming a bit line isolation layer filled in the trench;
   after forming the bit line isolation layer, forming a plurality of first semiconductor pillars arranged at intervals on a surface of the substrate;

forming a dielectric layer, wherein the dielectric layer covers a sidewall of the first semiconductor pillar by a certain height; and forming a plurality of word lines arranged at intervals, wherein the word lines are separated from the substrate, the word lines cover the first semiconductor pillars by a certain height and at least a part of the dielectric layer, the word lines extend along a second direction, and the second direction is different from the first direction;

the forming bit lines comprises:

forming a metal layer located on the sidewall of the trench, wherein the metal layer extends along the first direction, and the bit line isolation layer is in contact with the metal layer; and carrying out a metal silicide process by using formation temperature of the dielectric layer, such that metal atoms in the metal layer diffuse to the substrate between adjacent ones of the trenches to form a metal silicide layer, wherein the metal silicide layer and the metal layer constitute the bit line.

7. The method of manufacturing the semiconductor structure according to claim 6, wherein the forming a metal layer and a bit line isolation layer comprises:

forming an initial edge isolation layer on the sidewall of the trench;

forming an internal isolation layer filled in the trench, wherein the internal isolation layer is in contact with the initial edge isolation layer;

removing the initial edge isolation layer located on a top sidewall of the trench, and using the remaining initial edge isolation layer as an edge isolation layer, wherein the edge isolation layer and the internal isolation layer constitute the bit line isolation layer; and forming the metal layer on the top sidewall of the trench.

8. The method of manufacturing the semiconductor structure according to claim 6, wherein the forming first semiconductor pillars comprises:

forming a first semiconductor layer covering the substrate; and performing first patterning processing on the first semiconductor layer to form the first semiconductor pillars arranged at intervals; and before the forming a dielectric layer, the method of manufacturing the semiconductor structure further comprises: forming a bottom isolation layer, wherein the bottom isolation layer covers a bottom sidewall of the first semiconductor layer.

9. The method of manufacturing the semiconductor structure according to claim 8, wherein the first patterning processing and the forming a bottom isolation layer comprise:

removing a part of the first semiconductor layer along the first direction to form a plurality of first semiconductor walls arranged at intervals, wherein the first semiconductor wall extends along the first direction and is located on the substrate between adjacent ones of the trenches;

forming a first isolation wall between adjacent ones of the first semiconductor walls;

removing a part of the first semiconductor wall and a part of the first isolation wall along the second direction to form the first semiconductor pillar and a first isolation block, wherein the first semiconductor pillar and the first isolation block are alternately arranged in the second direction;

forming a second isolation wall between the adjacent ones of the first semiconductor pillars and between adjacent first isolation blocks; and removing the first isolation block and the second isolation wall by a certain height, such that the remaining first isolation block and second isolation wall serve as the bottom isolation layer to cover a bottom sidewall of the first semiconductor pillar.

10. The method of manufacturing the semiconductor structure according to claim 8, wherein the forming a first semiconductor layer comprises forming a first source-drain film, a channel film, and a second source-drain film that are stacked, wherein the first source-drain film, the channel film, and the second source-drain film constitute the first semiconductor layer;

a first source-drain region, a channel region, and a second source-drain region that are stacked are formed through the first patterning processing, wherein the first source-drain region, the channel region, and the second source-drain region constitute the first semiconductor pillar;

the dielectric layer covers a sidewall of the channel region and a sidewall of the second source-drain region; and the word line covers the dielectric layer located on the sidewall of the channel region and exposes the dielectric layer located on the sidewall of the second source-drain region.

11. The method of manufacturing the semiconductor structure according to claim 10, wherein the forming a plurality of word lines comprises:

forming a word line film filled between adjacent channel regions and between adjacent second source-drain regions, wherein the word line film further covers the dielectric layer;

etching back the word line film to remove the word line film filled between the adjacent second source-drain regions, and using the remaining word line film as an initial word line;

forming a first isolation film filled between the adjacent second source-drain regions;

removing a part of the first isolation film and the initial word line along the second direction to form a plurality of first isolation layers arranged at intervals, the word lines arranged at intervals, and a word line isolation trench between adjacent ones of the first isolation layers and between adjacent ones of the word lines; and forming a second isolation layer filled in the word line isolation trench.

12. The method of manufacturing the semiconductor structure according to claim 8, wherein the forming a first semiconductor layer comprises forming a first source-drain film and a channel film that are stacked, wherein the first source-drain film and the channel film constitute the first semiconductor layer;

a first source-drain region and a channel region that are stacked are formed through the first patterning processing, wherein the first source-drain region and the channel region constitute the first semiconductor pillar;

after the first semiconductor pillar is formed, the dielectric layer and the word line are formed, wherein the dielectric layer covers the sidewall of the channel region, and the word line covers the dielectric layer; and after the word line is formed, the method of manufacturing the semiconductor structure further comprises: forming a second semiconductor layer located on the first semiconductor pillar, wherein the second semiconductor layer is used as a second source-drain film; and performing second patterning processing on the second semiconductor layer to form a plurality of second semiconductor pillars arranged at intervals, wherein the second semiconductor pillars are each used as a second source-drain region and are directly opposite to the first semiconductor pillars respectively.

13. The method of manufacturing the semiconductor structure according to claim 12, wherein
a method for forming the first semiconductor layer comprises an epitaxial growth process; and/or
a method for forming the second semiconductor layer comprises the epitaxial growth process.

\* \* \* \* \*